United States Patent

Koyanagi

(10) Patent No.: US 6,700,521 B2
(45) Date of Patent: Mar. 2, 2004

(54) INTERPOLATING FUNCTION GENERATING APPARATUS AND METHOD, DIGITAL-ANALOG CONVERTER, DATA INTERPOLATOR, PROGRAM, AND RECORD MEDIUM

(75) Inventor: Yukio Koyanagi, Saitama (JP)

(73) Assignee: Neuro Solution Corp., Tokyo (JP)

( * ) Notice: Subject to any disclaimer, the term of this patent is extended or adjusted under 35 U.S.C. 154(b) by 0 days.

(21) Appl. No.: 10/275,247

(22) PCT Filed: Mar. 4, 2002

(86) PCT No.: PCT/JP02/01947

§ 371 (c)(1),
(2), (4) Date: Nov. 6, 2002

(87) PCT Pub. No.: WO02/071620

PCT Pub. Date: Sep. 12, 2002

(65) Prior Publication Data

US 2003/0107508 A1 Jun. 12, 2003

(30) Foreign Application Priority Data

Mar. 7, 2001 (JP) .......................................... 2001-63132

(51) Int. Cl.$^7$ ................................................ H03M 1/66
(52) U.S. Cl. ...................... 341/144; 341/118; 341/120; 708/819; 708/313; 708/420
(58) Field of Search ................................. 341/144, 145, 341/118, 120, 143; 708/819, 290, 300, 420, 313, 315

(56) References Cited

U.S. PATENT DOCUMENTS 4,953,117 A * 8/1990 Lagadec ...................... 708/313
6,392,398 B1 * 5/2002 Toraichi et al. ............ 324/76.21
6,411,238 B1 * 6/2002 Koyanagi et al. ............ 341/144

FOREIGN PATENT DOCUMENTS

| JP | 6-244679 A | 9/1994 |
| JP | 11-55076 A | 2/1999 |
| JP | 2001-69010 A | 3/2001 |

* cited by examiner

*Primary Examiner*—Brian Young
*Assistant Examiner*—John B Nguyen
(74) *Attorney, Agent, or Firm*—Connolly Bove Lodge & Hutz LLP; Larry J. Hume

(57) ABSTRACT

A digital input is 8-fold oversampled, delay circuits $11_{-1}$ to $11_{-4}$ and multipliers/adders 12 to 15 perform a convolution arithmetic while multipliers/adders 4 to 10 process the oversampling data into predetermined digital basic waveforms, and continuous interpolation values can be obtained, thereby requiring no low pass filter which causes deterioration of phase characteristics, and suppressing an interpolation abortion error by setting finite interpolating functions. Furthermore, by obtaining apart of oversampling data as input data by using an AND gate 2, a subsequent process using the digital basic waveform and the convolution arithmetic can be performed in a very simple process.

18 Claims, 5 Drawing Sheets

F I G. 3
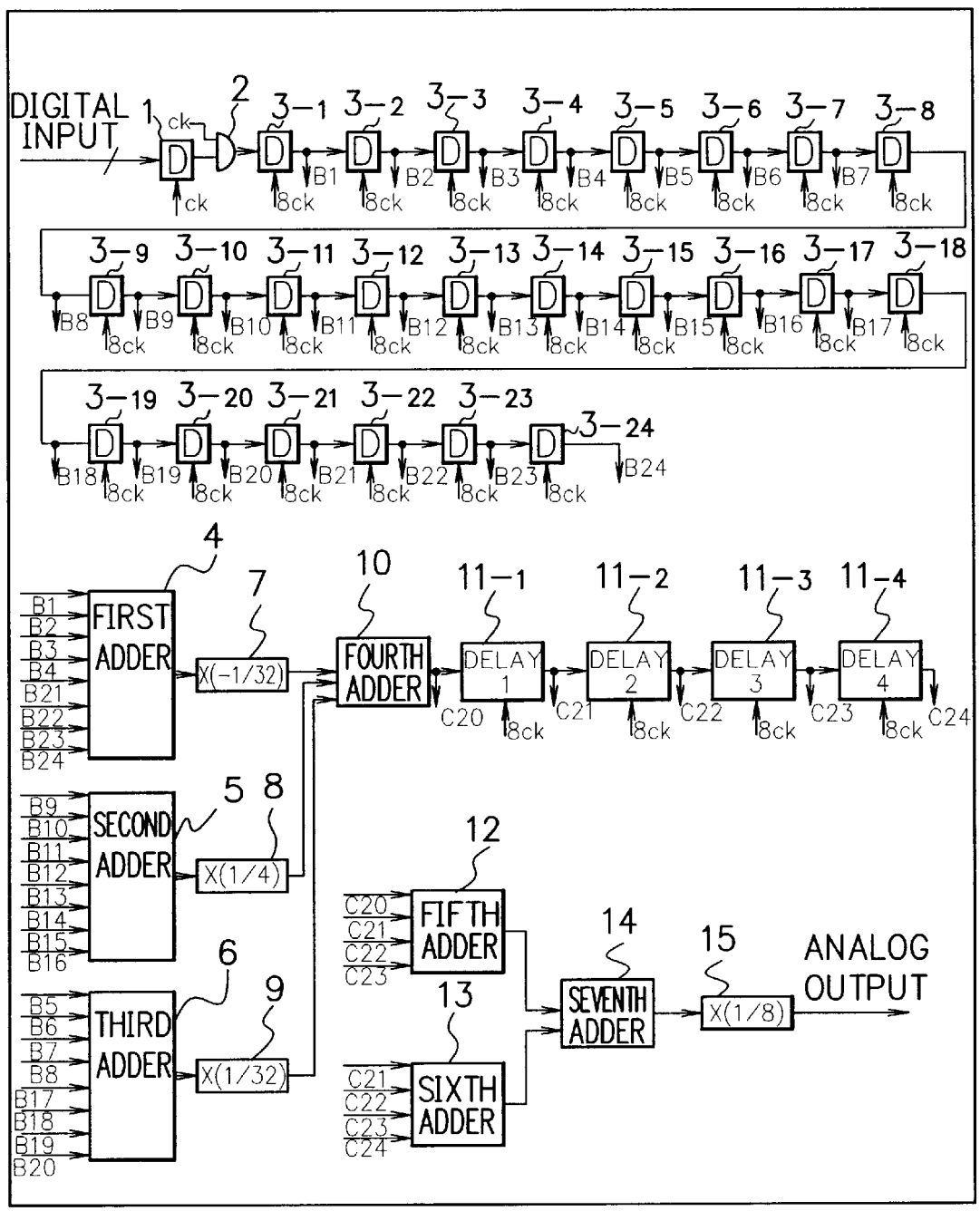

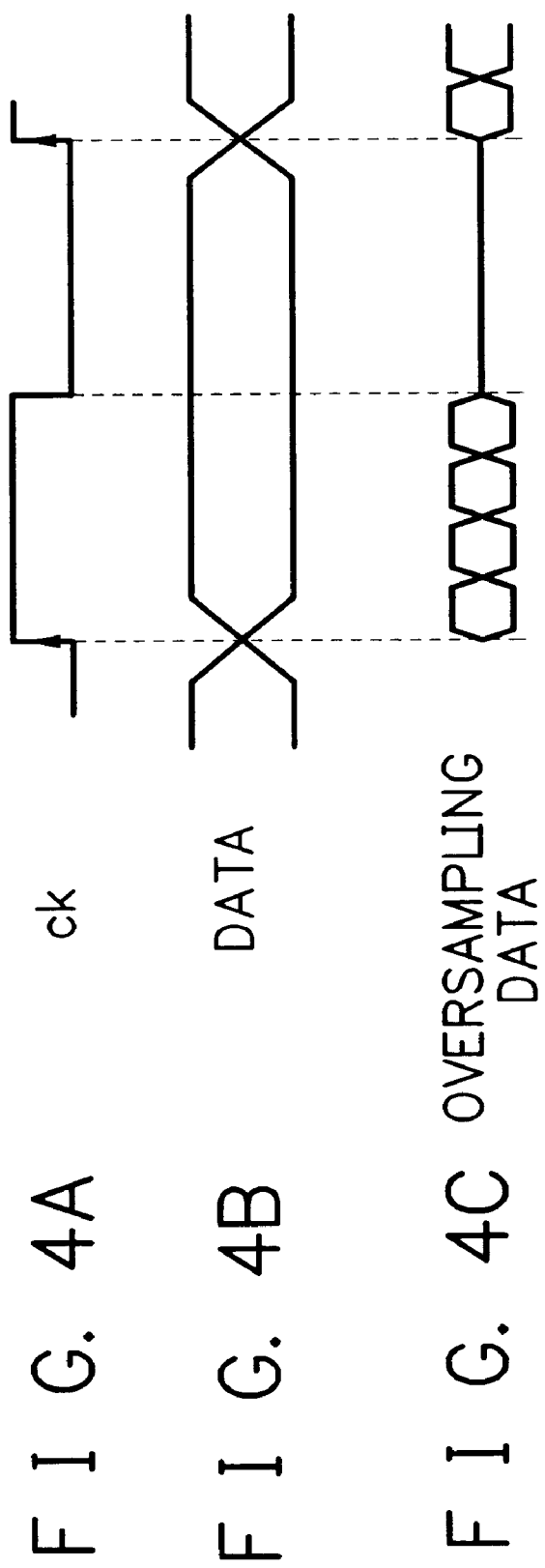

| LINE NUMBER | INPUT | INTERMEDIATE VALUE | OUTPUT |
|---|---|---|---|
| 1 | 0 | | |
| 2 | 0 | | |
| 3 | 0 | | |
| 4 | 0 | | |
| 5 | 0 | | |
| 6 | 0 | | |
| 7 | 0 | | |
| 8 | 0 | | |
| 9 | 0 | | |
| 10 | 0 | | |
| 11 | 0 | | |
| 12 | 0 | | |
| 13 | 0 | | |
| 14 | 0 | | |
| 15 | 0 | | |
| 16 | 0 | | |
| 17 | 0 | | |
| 18 | 0 | | |
| 19 | 0 | | |
| 20 | 0 | | |
| 21 | 0 | | |
| 22 | 0 | | |
| 23 | 0 | | |
| 24 | 0 | | |
| 25 | 0 | 0 | 0 |
| 26 | 0 | 0 | 0 |
| 27 | 1 | 0 | 0 |
| 28 | 1 | −0.25 | 0 |
| 29 | 1 | −0.5 | −0.03125 |
| 30 | 1 | −0.75 | −0.125 |
| 31 | 0 | −1 | −0.28125 |
| 32 | 0 | −0.5 | −0.5 |
| 33 | 0 | 0 | −0.65625 |
| 34 | 0 | 0.5 | −0.625 |
| 35 | 0 | 1 | −0.40625 |
| 36 | 0 | 2.75 | 0 |
| 37 | 0 | 4.5 | 0.65625 |
| 38 | 0 | 6.25 | 1.625 |
| 39 | 0 | 8 | 2.90625 |
| 40 | 0 | 8 | 4.5 |
| 41 | 0 | 8 | 6.03125 |
| 42 | 0 | 8 | 7.125 |
| 43 | 0 | 8 | 7.78125 |
| 44 | 0 | 6.25 | 8 |
| 45 | 0 | 4.5 | 7.78125 |
| 46 | 0 | 2.75 | 7.125 |
| 47 | 0 | 1 | 6.03125 |
| 48 | 0 | 0.5 | 4.5 |
| 49 | 0 | 0 | 2.90625 |
| 50 | 0 | −0.5 | 1.625 |
| 51 | 0 | −1 | 0.65625 |
| 52 | 0 | −0.75 | 0 |
| 53 | 0 | −0.5 | −0.40625 |
| 54 | 0 | −0.25 | −0.625 |
| 55 | 0 | 0 | −0.65625 |
| 56 | 0 | 0 | −0.5 |
| 57 | 0 | 0 | −0.28125 |
| 58 | 0 | 0 | −0.125 |
| 59 | 0 | 0 | −0.03125 |
| 60 | 0 | 0 | 0 |
| 61 | 0 | 0 | 0 |

A: INPUT
B: INTERMEDIATE VALUE * 8
C: OUTPUT * 8

INTERPOLATING FUNCTION GENERATING APPARATUS AND METHOD, DIGITAL-ANALOG CONVERTER, DATA INTERPOLATOR, PROGRAM, AND RECORD MEDIUM

BACKGROUND OF THE INVENTION

1. Field of the Invention

The present invention relates to an interpolating function generating apparatus and method, a digital-analog converter, a data interpolator, a program, and a record medium. In particular, it relates to a technology for interpolating discrete digital data to convert it into continuous analog signals.

2. Description of the Related Art

In a digital audio device such as a CD (compact disk) player, a DVD (digital video disk) player, etc., a digital-analog converter (D/A converter) to which an oversampling technology is applied is used to obtain a continuous analog audio signal from discrete digital audio data. In this type of D/A converter, data interpolation is performed normally by using a digital filter to raise a pseudo-sampling frequency by interpolating data among discretely input digital data.

Normally, a data interpolating process using a digital filter contained in a D/A converter is performed in a convolution arithmetic using a sampling function referred to as a sinc function. FIG. 1 is an explanatory view of a sinc function. A sinc function appears when a Dirac delta function is inversely Fourier transformed, and can be defined by sin (?ft)/(?ft) where a sampling frequency is represented by f. The value of the sinc function is 1 only at the sampling point of t=0, and the value is 0 at any other sampling points.

FIG. 2 shows a relationship between the discrete data and interpolation values in the data. In FIG. 2, the values of the discrete data at the respective sampling points t1, t2, t3, and t4 arranged at equal intervals are Y (t1), Y (t2), Y (t3), and Y (t4), and the interpolation value y corresponding to a predetermined position to (at a distance a from t2) between the sampling points t2 and t3 is obtained as follows.

Normally, when the interpolation value y is obtained by using a sampling function, the value of the sampling function at the interpolation position t0 is obtained for each piece of given discrete data, and a convolution arithmetic is performed by using the obtained values. Practically, the peak in the central position of the sampling function is set at the same level for each sampling point of t1 to t4, and the value (indicated by ?) of the sampling function at each interpolation position to is obtained and added up.

Although the interpolation position t0 changes with a lapse of time, the level of each sampling position also changes with a lapse of time. Therefore, the interpolation value y (t0) also continuously changes, thereby obtaining continuous analog signals smoothly connecting each piece of discrete data.

However, with the conventional D/A converter using the above mentioned oversampling technology, a stepwise signal waveform is obtained by interpolation, and passes through a low pass filter, thereby generating smooth analog signals. Therefor, there has been the problem that the deterioration of phase characteristic is superposed by the low pass filter on the output analog signals.

Furthermore, since the above mentioned sinc function converges into 0 at ??, it is necessary to obtain the values of the sinc functions for all pieces of discrete data and then perform a convolution addition when a correct interpolation value is to be obtained. However, practically with the performance, the circuit scale, etc. taken into account, the range of the discrete data is limited in performing a process using a digital filter. Therefore, an obtained interpolation value includes an abortion error, thereby failing in obtaining a correct interpolation value.

The present invention has been achieved to solve the above mentioned problems, and aims at generating smooth analog signals free of deterioration in phase characteristic by a low pass filter or free of distortion of waveform by abortion error in the interpolation performed using a sinc function.

The present invention also aims at obtaining an interpolating function for use in generating the above mentioned smooth analog signals through a simpler logic or algorithm.

SUMMARY OF THE INVENTION

The interpolating function generating apparatus according to the present invention includes: data input means for oversampling a piece of digital data, and obtaining a part of the oversampling data as input data; and arithmetic means for processing the input data obtained from the data input means using a digital basic waveform, and obtaining an interpolating function by performing a moving-average calculation or a convolution arithmetic on the processed digital data.

According to another aspect of the present invention, the data input means can obtain a first half or a second half of the oversampling data as the input data.

According to a further aspect of the present invention, the arithmetic means includes: first addition means for adding the digital data processed using the digital basic waveform to several pieces of data obtained by shifting the processed data by the phase of an oversampling cycle to perform the moving-average calculation or the convolution arithmetic; second addition means for adding up several pieces of data obtained by shifting the digital data processed using the digital basic waveform by the phase of an oversampling cycle; and third addition means for adding up the outputs of the first addition means and the second addition means.

The interpolating function generating method according to the present invention includes: a first step of oversampling a piece of digital data, and obtaining a part of the oversampling data as input data; a second step of processing the input data using a digital basic waveform; and a third step of obtaining an interpolating function by performing a moving-average calculation or a convolution arithmetic on the digital data processed using the digital basic waveform.

According to another aspect of the present invention, a first half or a second half of the oversampling data as the input data can be obtained in the first step.

According to a further aspect of the present invention, in the third step, the digital data processed in the second step is added to several pieces of data obtained by shifting the processed digital data by the phase of the oversampling cycle, the several pieces of data obtained by shifting the digital data processed using the digital basic waveform by the phase of the oversampling cycle are added up, and the addition results are further added up.

The digital-analog converter according to the present invention includes: data input means for oversampling each of plural pieces of discrete data and obtaining a part of the oversampling data as input data for each piece of the discrete data; and arithmetic means for processing the input data obtained by the data input means using a digital basic waveform, and combining the processed digital data in a moving-average calculation or a convolution arithmetic, thereby obtaining an interpolation value for the discrete data.

According to a further aspect of the present invention, the data input means oversamples each of the plural pieces of discrete data provided for each clock of a predetermined frequency, and obtains a part of the oversampling data as the input data for each clock period sectioned by the clock of the predetermined frequency.

According to another aspect of the present invention, the data input means can obtain a first half or a second half of the oversampling data as the input data for each clock period.

According to a further aspect of the present invention, the arithmetic means includes: first addition means for adding the digital data processed using the digital basic waveform to several pieces of data obtained by shifting the processed data by the phase of an oversampling cycle to perform the moving-average calculation or the convolution arithmetic; second addition means for adding up several pieces of data obtained by shifting the digital data processed using the digital basic waveform by the phase of an oversampling cycle; and third addition means for adding up the outputs of the first addition means and the second addition means.

The data interpolator according to the present invention includes: data input means for oversampling each of plural pieces of discrete data and obtaining a part of the oversampling data as input data for each piece of the discrete data; and arithmetic means for processing the input data obtained by the data input means using a digital basic waveform, and combining the processed digital data in a moving-average calculation or a convolution arithmetic, thereby obtaining an interpolation value for the discrete data.

According to a further aspect of the present invention, the data input means oversamples each of the plural pieces of discrete data provided for each clock of a predetermined frequency, and obtains a part of the oversampling data as the input data for each clock period sectioned by the clock of the predetermined frequency.

According to a further aspect of the present invention, the data input means can obtain a first half or a second half of the oversampling data as the input data for each clock period.

According to a further aspect of the present invention, the arithmetic means includes: first addition means for adding the digital data processed using the digital basic waveform to several pieces of data obtained by shifting the processed data by the phase of an oversampling cycle to perform the moving-average calculation or the convolution arithmetic; second addition means for adding up several pieces of data obtained by shifting the digital data processed using the digital basic waveform by the phase of an oversampling cycle; and third addition means for adding up the outputs of the first addition means and the second addition means.

The interpolating function generating program according to the present invention is used to direct a computer to function as data input means for oversampling a piece of digital data, and obtaining a part of the oversampling data as input data; and arithmetic means for processing the input data obtained from the data input means using a digital basic waveform, and obtaining an interpolating function by performing a moving-average calculation or a convolution arithmetic on the processed digital data.

The data interpolating program according to the present invention is used to direct a computer to function as data input means for oversampling each of plural pieces of discrete data and obtaining a part of the oversampling data as input data for each piece of the discrete data; and arithmetic means for processing the input data obtained by the data input means using a digital basic waveform, and combining the processed digital data in a moving-average calculation or a convolution arithmetic, thereby obtaining an interpolation value for the discrete data.

The computer-readable record medium according to the present invention records a program for directing a computer to function as each means as set forth in claim 15 or 16.

The present invention obtains an interpolation value by oversampling input digital data, and performing a moving-average calculation or a convolution arithmetic while processing the oversampling data using a digital basic waveform as described above. Since continuous interpolation values can be obtained only by performing the above mentioned digital process, smooth analog signals can be obtained as a result of D/A conversions on the values without a low pass filter, and without the deterioration of the phase characteristic by the filter. Furthermore, since the function generated using a digital basic waveform according to the present invention is a finite sampling function, the number of pieces of discrete data required to obtain an interpolation value can be reduced. Furthermore, although the number of pieces of discrete data to be processed is reduced, no abortion errors occur, thereby minimizing the distortion of an output waveform. Therefore, the quality of an output analog audio signal can be largely improved.

Furthermore, according to the present invention, a part of oversampling data is obtained as input data, and a process using a digital basic waveform, and a moving-average calculation or a convolution arithmetic are performed using a part of the oversampling data. Therefore, the process using a digital basic waveform, and a moving-average calculation or a convolution arithmetic can be performed in the simplest process. As a result, when the present invention is configured by hardware, it can be realized by an easier logic, thereby minimizing the circuit scale. When the present invention is configured by software, it can be realized by the simplest algorithm, thereby reducing the load of the process and performing the arithmetic operations at a higher speed.

BRIEF DESCRIPTION OF THE DRAWINGS

FIG. 3 shows an example of a configuration of an interpolating function generating apparatus, a digital-analog converter, or a data interpolator according to an embodiment of the present invention;

FIGS. 4A to 4C are timing charts of an operation of a data input unit according to an embodiment of the present invention;

DETAILED DESCRIPTION OF THE PREFERRED EMBODIMENTS

An embodiment of the present invention will be described below by referring to the attached drawings.

Figure 6:
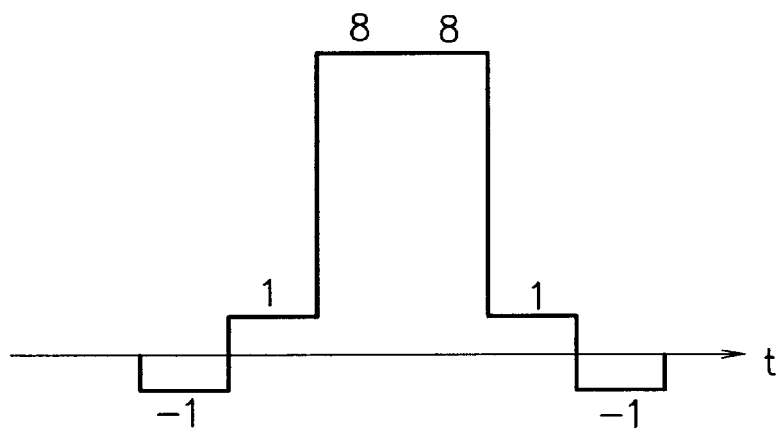
FIG. 6 shows a digital basic waveform used in the embodiments of the present invention.
Figure 7:
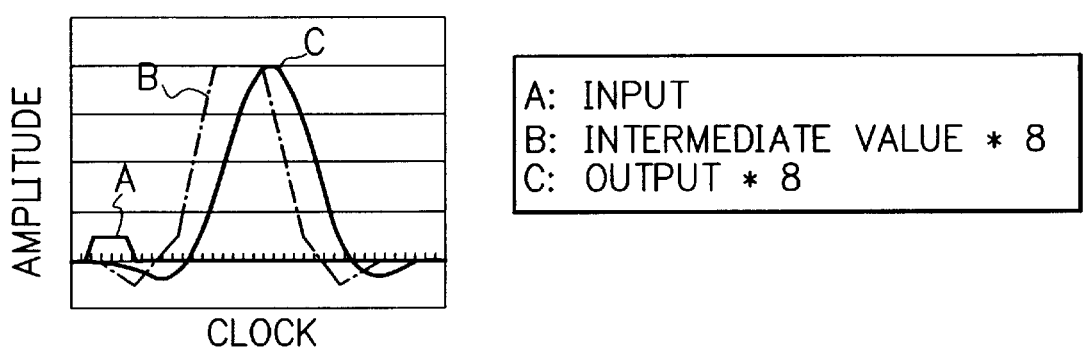
FIG. 7 shows a waveform represented by a graph of a sequence of values shown in FIG. 5.

According to the present embodiment, an input discrete digital data is processed by using a digital basic waveform as shown in FIG. 6, and a predetermined moving-average calculation or a convolution arithmetic is performed on the processed data, thereby obtaining an interpolating function as indicated by the solid line C shown in FIG. 7.

Figure 1:
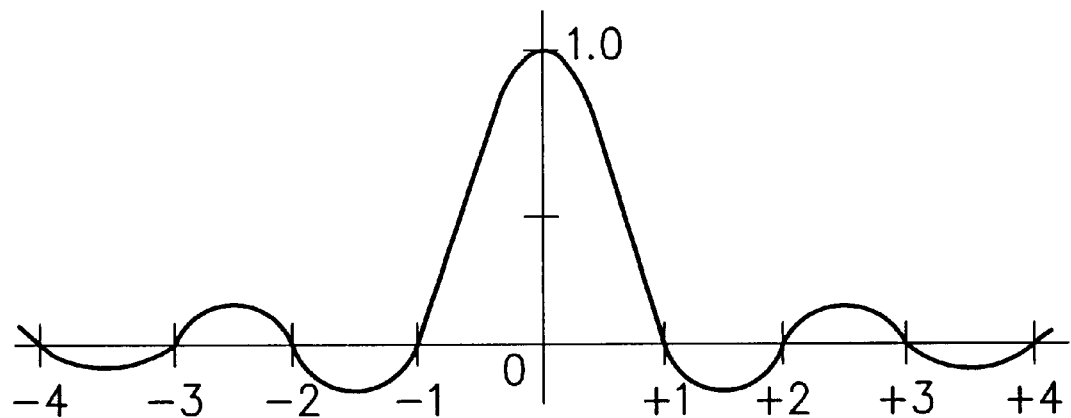
FIG. 1 is an explanatory view of a sinc function.
Figure 2:
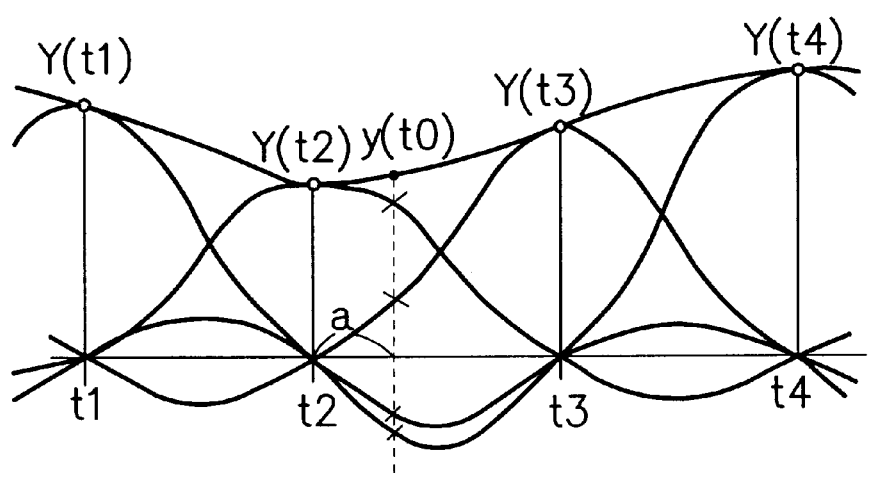
FIG. 2 is an explanatory view of an interpolating operation.

The function indicated by a solid line C shown in FIG. 7 is a sampling function, and is a once differentiable finite function (the value of a function having a finite value other than 0 in a local area, and having a value of 0 in other areas) function converging into 0 in the finite sampling position. Therefore, an interpolating process can be performed by using a once differentiable function in the discrete data by a superposing process based on each piece of discrete data using the sampling function shown in FIG. 7 instead of the conventional sinc function shown in FIG. 1.

Using this technology, continuous interpolation values can be obtained only by performing a predetermined digital process, and smooth analog signals can be obtained by D/A converting the values without using any low pass filter. Furthermore, since an interpolating function generated from a digital basic waveform is a finite sampling function, a correct interpolation value can be obtained only using finite discrete data without an abortion error, thereby minimizing the distortion of an output waveform.

The applicant of the present invention has already filed a patent application relating to the above mentioned technology (for example, Japanese Patent Application No. 11-173245). However, to obtain the interpolating function as shown in FIG. 7 using the technology disclosed in the patent application, it is necessary to perform a relatively complicated convolution arithmetic. Therefore, to realize this as hardware, a number of delay circuits, addition circuits, etc., are required thereby configuring a large circuit. Furthermore, when the system is realized as software, the load of the process becomes heavy, and is performed at a low speed of arithmetic operations. The embodiments described below have solved these problems.

FIG. 3 shows an example of a configuration of an interpolating function generating apparatus 100 according to the present embodiment. In FIG. 3, a D-type flipflop (hereinafter referred to as a D?FF) 1 holds input digital data according to the clock ck of a predetermined frequency (for example, 44.1 KHz). An AND gate 2 outputs a logical product of the digital data input from the D?FF 1 and the clock ck to a D?FF $3_{-1}$. The D?FF $3_{-1}$ holds the digital data output by the AND gate 2 according to, for example, the clock 8ck of a 8-fold frequency.

The data input means of the present invention is configured by the D?FF 1, the AND gate 2, and the D?FF $3_{-1}$. FIGS. 4A to 4C are timing charts showing an operation of a data input means. The digital data shown in FIG. 4B is held in the D?FF 1 in synchronization with the rising edge of the clock ck shown in FIG. 4A. The AND gate 2 outputs the digital data only while the clock ck indicates 'H' based on the logical product of the digital data held by the D?FF 1 and the clock ck.

At this time, the D?FF $3_{-1}$ holds the digital data output by the AND gate 2 according to the clock 8ck having an 8-fold frequency as shown in FIG. 4C. Thus, the data input means obtains a first half (corresponding to four clocks) of the 8-fold oversampling data as input data.

In this example, the first half of the 8-fold oversampling data is obtained as input data in an AND operation between the digital data and the clock ck. However, a second half of the 8-fold oversampling data can also be obtained as input data in the NAND operation.

Twenty-four D?FF $3_{-1}$ to $3_{-24}$ serially connected to the end of the AND gate 2 sequentially holds the oversampling data (data of the first half in one clock ck period) output by the AND gate 2 while delaying the data by one clock according to the clock 8ck having an 8-fold frequency. The data B1 to B24 output after sequentially delayed by these twenty-four D?FF $3_{-1}$ to $3_{-24}$ are appropriately distributed and input into first to third adders 4 to 6.

The first adder 4 receives data B1 to B4 output from four D?FF $3_{-1}$ to $3_{-4}$ positioned closest to the input side and data B21 to B24 output from four D?FF $3_{-21}$ to $3_{-24}$ positioned closest to the output side, adds up the data, and outputs an addition result. That is, the first adder 4 generates the portion of '−1, −1' corresponding to the both sides of the digital basic waveform shown in FIG. 6.

A second adder 5 receives data B9 to B16 output from eight D?FF $3_{-9}$ to $3_{-16}$ positioned at the center, adds up the data, and output an addition result. That is, the second adder 5 corresponds to the portion which generates '8, 8' corresponding to the central portion of the digital basic waveform shown in FIG. 6.

A third adder 6 receives data B5 to B8 output from the D?FF $3_{-5}$ to $3_{-8}$ which are the fifth to eighth D?FF from the input side and data B17 to B20 output from D?FF $3_{-17}$ to $3_{-20}$ which are the fifth to eighth D?FF from the output side, adds up the data, and outputs an addition result. That is, the third adder 6 corresponds to the portion which generates '1, 1' of the digital basic waveform shown in FIG. 6.

A −1/32-fold multiplier 7 multiplies the addition result output from the first adder 4 by −1/32. A 1/4-fold multiplier 8 multiplies the addition result output from the second adder 5 by 1/4. A 1/32-fold multiplier 9 multiplies the addition result output from the third adder 6 by 1/32. The fourth adder 10 adds the multiplication result output from each of the multipliers 7 to 9.

The multiplication rates '−1/32', '1/4', and '1/32' of the multipliers 7 to 9 correspond to the rates '−1', '8', and '1' of the digital basic waveforms shown in FIG. 6. Therefore, by a fourth adder 10 adding up the multiplication results obtained by each of the multipliers 7 to 9, the digital data input by the data input means is processed using the digital basic waveform shown in FIG. 6. If a piece of digital data having the amplitude of '1' is input, the digital waveform obtained by the fourth adder 10 is the waveform itself shown in FIG. 6.

Four delay circuits $11_{-1}$ to $11_{-4}$ serially connected to the last stage of the fourth adder 10 sequentially delay by one clock the data output from the fourth adder 10 according to the 8-fold frequency clock 8ck. These delay circuits $11_{-1}$ to $11_{-4}$ are configured by an analog delay such as a sample hold, etc. in an analog process, and a D?FF in a digital process.

The data C20 output from the fourth adder 10 and the data C21 to C24 sequentially delayed and output by each of the delay circuits $11_{-1}$ to $11_{-4}$ are appropriately distributed and input by the fifth and sixth fifth adders 12 and 13.

The fifth adder 12 adds up the data C20 (digital data processed using the digital basic waveform) output from the fourth adder 10, and data C21 to C23 (three pieces of digital data obtained by shifting by the phase of the oversampling cycle) output from each of the delay circuits $11_{-1}$ to $11_{-3}$. A fifth adder 12 corresponds to the first addition means according to the present invention.

A sixth adder 13 adds up the data C21 to C24 (four pieces of digital data obtained by shifting the digital data processed using the digital basic waveform by the phase of the oversampling cycle) output from the delay circuits $11_{-1}$ to $11_{-4}$. The sixth adder 13 corresponds to the second addition means according to the present invention.

A seventh adder 14 adds the output result of the fifth and sixth adders 12 and 13. The seventh adder 14 corresponds to the third addition means according to the present invention. By each of the delay circuits $11_{-1}$ to $11_{-4}$ and the fifth to seventh adders 12 to 14, a moving-average calculation or a convolution arithmetic are performed.

A ⅛-fold multiplier 15 multiplies the addition result output from the seventh adder 14 by ⅛. The process is performed to match the amplitude increased by the addition through the moving-average calculation or the convolution arithmetic with the amplitude of the original digital input. In the above mentioned process, smooth interpolation values close to the analog generated from the original data are output from the ⅛-fold multiplier 15.

The configuration in and after the D?FF $3_{-1}$ corresponds to the arithmetic means according to the present invention for performing a moving-average calculation or a convolution arithmetic after processing the oversampling data using the digital basic waveform.

Figures 5A, 5B:
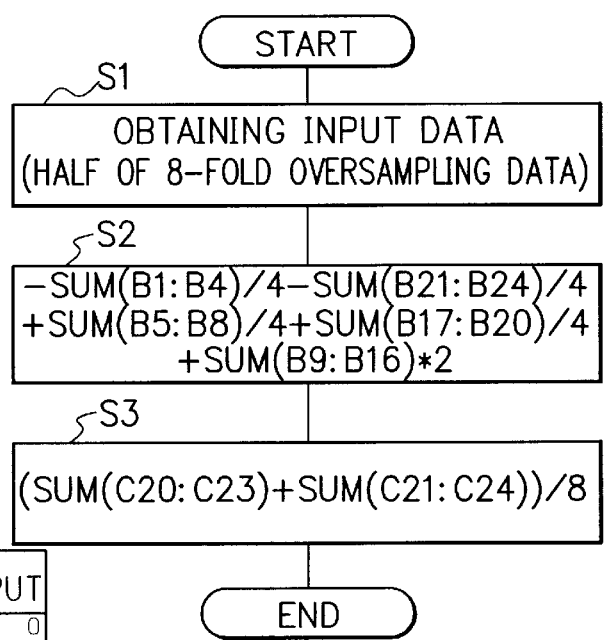
FIGS. 5A and 5B is a flowchart and a sequence of values showing the operation performed when an embodiment of an example is realized by software.

Described above is the case in which the interpolating function indicated by the solid line C shown in FIG. 7 is obtained by a hardware configuration, but it can also be obtained in a software process. FIGS. 5A and 5B show the operation performed when the process is performed by software. FIG. 5A is a flowchart, FIG. 5B shows a sequence of values obtained in each operation step of the flowchart.

The sequence of values shown in FIG. 5B shows an example of a result of processing a piece of digital data whose amplitude is '1'. The sequence of values shown in FIG. 5B is represented by a waveform graph as shown in FIG. 7.

In FIG. 5A, first in step S1, the first half of the data in the 8-fold oversampling data included in one clock ck period is obtained as input data. The sequence of values of the input data is shown in the second column from the left in FIG. 5B. The sequence of 0s in lines 1 to 24 are provided with the delay corresponding to D?FF $3_{-1}$ to $3_{-24}$ taken into account. The waveform corresponding to the sequence of values is indicated by the solid line A in FIG. 7.

Then, in step S2, the arithmetic of −SUM(B1:B4)/4−SUM(B21:B24)/4+SUM(B5:B8)/4+SUM(B17:B20)/4+SUM(B9:B16)*2 is performed (B1 through B24 correspond to the data output from the D?FF $3_{-1}$ to $3_{-24}$ shown in FIG. 3). The sequence of values of the intermediate value data obtained by the arithmetic is shown on the third column in FIG. 5B. The waveform corresponding to the sequence of values is indicated by the alternate long and short dash line B shown in FIG. 7. When the first intermediate value (intermediate value in line 25) is obtained, an arithmetic is performed using the input data of lines 1 to 24 as B1 to B24. Additionally, for example, when an intermediate value (=−0.25) in line 28 is obtained, the arithmetic is performed using the input data in lines 4 to 27 as B1 to B24.

In this example, the multiplication rates are −¼, 2, and ¼, and they are 8-fold values as compared with the values shown in FIG. 3. They are set larger only for visibility of the graph shown in FIG. 7 by setting larger scaling factors for convenience.

Then, in step S3, the arithmetic of (SUM(C20:C23)+SUM(C21:C24))/8 is performed (C20 to C24 correspond to the data output from the fourth adder 10 and the delay circuits $11_{-1}$ to $11_{-4}$ shown in FIG. 3). The sequence of values of the output data obtained in the arithmetic is shown in column 4 in FIG. 5B. Furthermore, the waveform corresponding to the sequence of values is indicated by the solid line C shown in FIG. 7. In this embodiment, when the first output data (output data in line 25) is obtained, the arithmetic is performed with the intermediate value data in lines 20 to 24 set as C20 to C24. When, for example, the output data of line 29 (=−0.03125) is obtained, the arithmetic is performed with the intermediate value data in lines 24 to 28 set as C20 to C24.

In FIG. 7, the horizontal axis indicates the clock $8ck$ of an 8-fold frequency while the vertical axis indicates the amplitude of the data. The input waveform A in this case corresponds to the waveform of the 8-fold oversampling data of the first half in one clock ck held in the D?FF $3_{-1}$ shown in FIG. 3. The waveform B of the intermediate value corresponds to the waveform (8-fold) of the data output from the fourth adder 10 shown in FIG. 3. Furthermore, the output waveform C corresponds to the waveform (8-fold) of the data output from the ⅛-fold multiplier 15 shown in FIG. 3.

In the explanation above, a piece of data indicating the amplitude of 1 as digital data is input and the interpolating function shown in FIG. 7 is obtained based on the input data. Additionally, by sequentially inputting discrete digital data whose amplitude change, the apparatus shown in FIG. 3 can be used as a D/A converter or a data interpolator as is. That is, by using the function indicated by the output data shown in FIG. 7 as an interpolating function and interpolating discrete digital data sequentially input at each clock ck, the digital data can be converted into smooth analog signals.

In this case, the discrete digital data is 8-fold oversampled, and only the first half of the data is used, thereby forming a blank of four clocks for an adjacent input and sequentially inputting data. Then, data is combined in a moving-average calculation or a convolution arithmetic while each piece of oversampling data is processed using a digital basic waveform.

In other words, a plurality of digital basic waveforms having amplitudes depending on the values of the input discrete data are combined in a moving-average calculation or a convolution arithmetic while they are shifted by half (4 clocks) of the 8-fold frequency clock $8ck$. Thereby, the discrete digital data is interpolated depending on the interpolating function as shown in FIG. 7.

According to the present embodiment, continuous interpolation values can be obtained only by performing the above mentioned digital process, and smooth analog signals can be obtained by D/A converting the values without using a low pass filter. Therefore, the deterioration of a phase characteristic by a low pass filter can be suppressed. Furthermore, since an interpolating function generated from a digital basic waveform is a finite sampling function, a correct interpolation value can be obtained only by using finite discrete data without an abortion error, thereby minimizing the distortion of an output waveform. Thereby, for example, when digital voice of a compact disk (CD) is input and converted into analog, voice can be obtained with entirely moderate and excellent sound both in high- and low pitched tone, and close to the sound of analog recording.

Furthermore, according to the present embodiment, input digital data is oversampled in the input stage of digital data, and a part of the oversampling data is obtained as input data. As a result, the subsequent process using a digital basic waveform and a moving-average calculation or a convolution arithmetic can be performed in the simplest process for the following reasons.

That is, as shown in FIG. 6, the digital basic waveform used in the present embodiment is generated by changing the data value into −1, 1, 8, 8, 1, and −1. Assuming that the portion of the equal central values of 8, 8 is one clock ck period, the remaining portion of −1, 1, 1, −1 is a ½ clock period. Therefore, if only a half of the oversampling data is input in the input stage, then a process using a digital basic waveform can be performed only by simply adding the input data using the first to third adders 4 to 6, etc., and the subsequent moving-average calculation or convolution arithmetic can be performed only by delay and simple addition.

Thereby, when the interpolating function generating apparatus, the digital-analog converter, or the data interpolator are configured by hardware as shown in FIG. 3, it can be realized by a simple logic. Therefore, the smallest possible number of delay circuits, addition circuits, etc. can configure the apparatus, thereby reducing the circuit scale.

Also when the interpolating function generating apparatus, the digital-analog converter, or the data interpolator is configured by software, a very simple algorithm can be used to realize it with the smallest possible process amount. Thus, the load of the process can be reduced, and the arithmetic can be performed at a high speed.

Furthermore, in the above mentioned embodiment, the digital basic waveform is set to −1, 1, 8, 8, 1, and −1, and a corresponding weight (−1/32, ¼, 1/32) is assigned to each of the values, but the digital basic waveform (weight value) is not limited to this application. That is, any weight can be assigned so far as an obtained interpolating function is once differentiable in the entire area, and a finite function converges into 0 in the finite sampling position. For example, the weights on both sides can be 1/32 or 0 instead of −1/32. Furthermore, the weight for the central portion can be any value other than ¼. In any case, an acceptable curve interpolation can be realized.

Furthermore, the convolution arithmetic represented in the above mentioned embodiment is only an example, and the present invention is not limited to the application.

Additionally, in the above mentioned embodiments, a digital input is 8-fold oversampled, but it is not limited to 8-fold oversampling. For example, lower factors 2, 4, etc. are acceptable, and higher factors 16, 32, etc. are also acceptable. When lower factors are used, the number of delay circuits can be reduced, and the scale of each adder can also be reduced, thereby realizing an entirely smaller apparatus. On the other hand, when a larger factors are used, the accuracy of interpolation can be enhanced, and the quality of an obtained analog signal can be improved.

Furthermore, according to the above mentioned embodiments, the first half or the second half of the oversampling data is obtained as input data, but the input data is not limited to this application. That is, data can be used every other piece or at random to obtain a half of the oversampling data in one clock ck period as input data.

Additionally, the interpolating method according to the present embodiment can be realized by a hardware configuration, DSP or a software configuration. For example, when it is realized by software, the interpolating function generating apparatus, the digital-analog converter, or the data interpolator according to the present embodiment is actually configured by a CPU or MPU, RAM, ROM, etc. of a computer, and can be realized by operating the program stored in the RAM and ROM.

Therefore, a program for directing a computer to perform the functions of the above mentioned embodiments is recorded in the record medium such as CD-ROM, etc. and the apparatus can be realized by allowing the computer to read the program. The record medium for recording the program can be, in addition to the CD-ROM, a floppy disk, a hard disk, a magnetic tape, an optical disk, a magneto-optic disk, a DVD, a nonvolatile memory card, etc. Furthermore, the apparatus can be realized by downloading the above mentioned program to the computer through a network such as Internet, etc.

In addition, by the computer executing a provided program, the functions of the above mentioned embodiments can be realized, and the program can cooperate with the OS (operating system) operating in the computer or other application software, etc. to realize the functions of the above mentioned embodiments, or all or a part of the processes of the provided program are performed by a function extension board or a function extension unit of a computer, thereby realizing the functions of the above mentioned embodiments. In these cases, the programs are included as the embodiments of the present invention.

Furthermore, the above mentioned embodiments are only practical examples of the present invention, and are not interpreted as limiting the technological scope of the present invention. That is, the present invention can be embodied in various forms within the original spirit and the gist.

[Industrial Applicability]

The present invention is effective in generating smooth analog signals with reduced deterioration in phase characteristic by a low pass filter or with reduced distortion of a waveform by an interpolation abortion error using a sinc function.

Furthermore, the present invention is also effective in obtaining an interpolating function for use in generating smooth analog signals using a simpler logic or algorithm.

What is claimed is:

1. An interpolating function generating apparatus, characterized by comprising:

data input means for oversampling a piece of digital data, and obtaining a part of oversampling data as input data; and arithmetic means for processing the input data obtained from said data input means using a digital basic waveform, and obtaining an interpolating function by performing a moving-average calculation or a convolution arithmetic on processed digital data.

2. The interpolating function generating apparatus according to claim 1, said data input means can obtain a first half or a second half of the oversampling data as the input data.

3. The interpolating function generating apparatus according to claim 1, said arithmetic means comprises:

first addition means for adding the digital data processed using the digital basic waveform to several pieces of data obtained by shifting the processed data by a phase of an oversampling cycle to perform the moving-average calculation or the convolution arithmetic;

second addition means for adding up several pieces of data obtained by shifting the digital data processed using the digital basic waveform by the phase of an oversampling cycle; and third addition means for adding up outputs of said first addition means and said second addition means.

4. An interpolating function generating method, characterized by comprising:

a first step of oversampling a piece of digital data, and obtaining a part of the oversampling data as input data;

a second step of processing the input data using a digital basic waveform; and a third step of obtaining an interpolating function by performing a moving-average calculation or a convolution arithmetic on the digital data processed using the digital basic waveform.

5. The interpolating function generating method according to claim 4, a first half or a second half of the oversampling data as the input data can be obtained in said first step.

6. The interpolating function generating method according to claim 4, in said third step, the digital data processed in said second step is added to several pieces of data obtained by shifting the processed digital data by the phase of the oversampling cycle, the several pieces of data obtained by shifting the digital data processed using the digital basic waveform by the phase of the oversampling cycle are added up, and addition results are further added up.

7. A digital-analog converter, characterized by comprising:

data input means for oversampling each of plural pieces of discrete data and obtaining a part of oversampling data as input data for each piece of the discrete data; and arithmetic means for processing the input data obtained by said data input means using a digital basic waveform, and combining processed digital data in a moving-average calculation or a convolution arithmetic, thereby obtaining an interpolation value for the discrete data.

8. The digital-analog converter according to claim 7, said data input means oversamples each of the plural pieces of discrete data provided for each clock of a predetermined frequency, and obtains a part of the oversampling data as the input data for each clock period sectioned by a clock of a predetermined frequency.

9. The digital-analog converter according to claim 8, said data input means can obtain a first half or a second half of the oversampling data as the input data for each clock period.

10. The digital-analog converter according to claim 7, said arithmetic means comprises:

first addition means for adding the digital data processed using the digital basic waveform to several pieces of data obtained by shifting the processed data by a phase of an oversampling cycle to perform the moving-average calculation or the convolution arithmetic;

second addition means for adding up several pieces of data obtained by shifting the digital data processed using the digital basic waveform by the phase of an oversampling cycle; and third addition means for adding up the outputs of said first addition means and said second addition means.

11. A data interpolator, characterized by comprising:

data input means for oversampling each of plural pieces of discrete data and obtaining a part of oversampling data as input data for each piece of the discrete data; and arithmetic means for processing the input data obtained by said data input means using a digital basic waveform, and combining processed digital data in a moving-average calculation or a convolution arithmetic, thereby obtaining an interpolation value for the discrete data.

12. The data interpolator according to claim 11, said data input means oversamples each of the plural pieces of discrete data provided for each clock of a predetermined frequency, and obtains a part of the oversampling data as the input data for each clock period sectioned by a clock of a predetermined frequency.

13. The data interpolator according to claim 12, said data input means can obtain a first half or a second half of the oversampling data as the input data for each clock period.

14. The data interpolator according to claim 11, said arithmetic means comprises:

first addition means for adding the digital data processed using the digital basic waveform to several pieces of data obtained by shifting processed data by a phase of an oversampling cycle to perform the moving-average calculation or the convolution arithmetic;

second addition means for adding up several pieces of data obtained by shifting digital data processed using the digital basic waveform by a phase of an oversampling cycle; and third addition means for adding up outputs of said first addition means and said second addition means.

15. An interpolating function generating program for directing a computer to function as data input means for oversampling a piece of digital data, and obtaining a part of the oversampling data as input data; and arithmetic means for processing the input data obtained from said data input means using a digital basic waveform, and obtaining an interpolating function by performing a moving-average calculation or a convolution arithmetic on processed digital data.

16. A data interpolating program for directing a computer to function as data input means for oversampling each of plural pieces of discrete data and obtaining a part of the oversampling data as input data for each piece of the discrete data; and arithmetic means for processing the input data obtained by said data input means using a digital basic waveform, and combining the processed digital data in a moving-average calculation or a convolution arithmetic, thereby obtaining an interpolation value for the discrete data.

17. A computer-readable record medium, characterized by storing a program for directing a computer to function as each means according to claim 15.

18. A computer-readable record medium, characterized by storing a program for directing a computer to function as each means according to claim 16.

* * * * *